United States Patent
Yang

(10) Patent No.: US 9,159,775 B1
(45) Date of Patent: Oct. 13, 2015

(54) ANODE CONNECTION STRUCTURE OF ORGANIC LIGHT-EMITTING DIODE AND MANUFACTURING METHOD THEREOF

(71) Applicant: Shenzhen China Star Optoelectronics Technology Co., Ltd., Shenzhen, Guangdong (CN)

(72) Inventor: Tsungying Yang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/732,718

(22) Filed: Jun. 6, 2015

Related U.S. Application Data

(62) Division of application No. 14/008,607, filed on Sep. 30, 2013.

(51) Int. Cl.
| | |
|---|---|
| *H01L 21/00* | (2006.01) |
| *H01L 27/32* | (2006.01) |
| *H01L 51/56* | (2006.01) |
| *H01L 51/52* | (2006.01) |
| *H01L 29/786* | (2006.01) |

(52) U.S. Cl.
CPC ...... *H01L 27/3248* (2013.01); *H01L 29/78603* (2013.01); *H01L 29/78672* (2013.01); *H01L 51/5206* (2013.01); *H01L 51/56* (2013.01); *H01L 2227/323* (2013.01)

(58) Field of Classification Search
CPC . H01L 27/32; H01L 27/3225; H01L 2227/32; H01L 2251/50; H01L 2924/12044; H01L 27/3258; H01L 27/3262
See application file for complete search history.

(56) References Cited

U.S. PATENT DOCUMENTS

| | | | |
|---|---|---|---|
| 2007/0176170 A1* | 8/2007 | Ho et al. | 257/40 |
| 2014/0166996 A1* | 6/2014 | Kim | 257/40 |

* cited by examiner

*Primary Examiner* — Thanh Y Tran
(74) *Attorney, Agent, or Firm* — Andrew C. Cheng

(57) ABSTRACT

A method is provided for manufacturing an anode connection structure of an organic light-emitting diode. The anode connection structure includes: a thin-film transistor and an anode of an organic light-emitting diode arrange don the thin-film transistor. The thin-film transistor includes a low-temperature poly-silicon layer formed on a substrate, a gate insulation layer formed on the low-temperature poly-silicon layer, a gate formed on the gate insulation layer, a protection layer formed on the gate, and a source/drain formed on the protection layer. The method includes a step of forming a hole in the thin-film transistor to expose the low-temperature poly-silicon layer and a step of forming an electrically conductive layer in the hole for direct engagement with the low-temperature poly-silicon layer to serve as an anode and also the source/drain of the thin-film transistor. The anode of the organic light-emitting diode is thus directly connected to the low-temperature poly-silicon layer.

5 Claims, 3 Drawing Sheets

ANODE CONNECTION STRUCTURE OF ORGANIC LIGHT-EMITTING DIODE AND MANUFACTURING METHOD THEREOF

CROSS REFERENCE TO RELATED APPLICATIONS

This is a divisional application of co-pending patent application Ser. No. 14/008,607, "Anode Connection Structure of Organic Light-Emitting Diode and Manufacturing Method Thereof", filed on Sep. 30, 2013.

BACKGROUND OF THE INVENTION

1. Field of the Invention

The present invention relates to the field of light-emitting diodes, and in particular to an anode connection structure of an organic light-emitting diode and a manufacturing method thereof.

2. The Related Arts

An organic light-emitting diode display (OLED), which is also referred to as an organic electroluminescent diode, is a novel displaying technology of which the development was dated back to the middle of the 20th century. The organic electroluminescent diode has various advantages over a liquid crystal display, such as being fully solid state, active emission of light, high brightness, high contrast, being ultra thin, low cost, low power consumption, fast response, wide view angle, wide range of operation temperature, and being capable of flexible displaying. The structure of an organic electroluminescent diode generally comprises a substrate, an anode, a cathode, and an organic function layer and the principle of light emission thereof is that multiple layers of organic materials that are of extremely small thickness is formed between the anode and the cathode through vapor deposition, whereby positive and negative carriers, when injected into the organic semiconductor films, re-combine with each other to generate light. The organic function layer of the organic electroluminescent diode is generally made up of three function layers, which are respectively a hole transport layer (HTL), an emissive layer (EML), and an electron transport layer (ETL). Each of the function layers can be a single layer or more than one layer. For example, the hole transport layer may sometimes be further divided into a hole injection layer and a hole transport layer and the electron transport layer may also be divided into an electron transport layer and an electron injection layer. However, they are of substantially the same function and are thus collectively referred to as the hole transport layer and the electron transport layer.

Currently, the manufacture of a full-color organic electroluminescent diode is generally done with three methods, which are RGB juxtaposition and individual emission method, white light in combination with color filter method, and color conversion method, among which the RGB juxtaposition and individual emission method is most promising and has the most practical applications. The manufacturing method thereof is that red, green, and blue use different subject and object light-emitting materials.

The organic light-emitting diodes can be classified in two types, according to the method of driving, which are active driving and passive driving, namely direct addressing and TFT (Thin-Film Transistor) matrix addressing. The active driving type organic light-emitting diode is the so called active matrix organic light emitting device (AMOLED).

The AMOLED has a pixel circuit and a compensation circuit that are much more complicated than those of a liquid crystal display (LCD) and thus, for the conventional AMOLED products, the available number of pixels per inch (PPI) is less than 280, rendering the resolution relatively low.

Referring to FIGS. 1 and 2, schematic views are given to show a conventional anode connection structure of an organic light-emitting diode. An anode 100 is electrically connected to a low-temperature poly-silicon layer 50 by driving the source/drain terminal 300 of the thin-film transistor. Due to the arrangement of a metal layer of the source/drain terminal 300, the distance between switching thin-film transistors on the two sides is increased, whereby the area of the pixel is relatively large and thus the number of pixels per inch is reduced, leading to a relatively low resolution.

SUMMARY OF THE INVENTION

An object of the present invention is to provide an anode connection structure of an organic light-emitting diode, which has a simple structure, a low cost, a small pixel area, and a high resolution.

Another object of the present invention is to provide a manufacturing method of an anode connection structure of an organic light-emitting diode, which has a simply manufacturing process and can effectively reduce a pixel area and improve resolution.

To achieve the objects, the present invention provides an anode connection structure of an organic light-emitting diode, which comprises: a thin-film transistor and an anode of an organic light-emitting diode arranged on the thin-film transistor. The thin-film transistor comprises a low-temperature poly-silicon layer formed on a substrate, a gate insulation layer formed on the low-temperature poly-silicon layer, a gate formed on the gate insulation layer, a protection layer formed on the gate, and a source/drain formed on the protection layer. The anode of the organic light-emitting diode is connected to the low-temperature poly-silicon layer.

A planarization layer is arranged between the thin-film transistor and the anode of the organic light-emitting diode.

The substrate comprises a glass substrate.

An isolation layer is formed between the substrate and the low-temperature poly-silicon layer.

The anode of the organic light-emitting diode comprises one of an indium tin oxide layer, an indium zinc oxide layer, an aluminum layer, a silver layer, and a molybdenum layer or a lamination thereof.

The present invention also provides an anode connection structure of an organic light-emitting diode, which comprises: a thin-film transistor and an anode of an organic light-emitting diode arranged on the thin-film transistor, the thin-film transistor comprising a low-temperature poly-silicon layer formed on a substrate, a gate insulation layer formed on the low-temperature poly-silicon layer, a gate formed on the gate insulation layer, a protection layer formed on the gate, and a source/drain formed on the protection layer, the anode of the organic light-emitting diode being connected to the low-temperature poly-silicon layer;

wherein a planarization layer is arranged between the thin-film transistor and the anode of the organic light-emitting diode.

The substrate comprises a glass substrate.

An isolation layer is formed between the substrate and the low-temperature poly-silicon layer.

The anode of the organic light-emitting diode comprises one of an indium tin oxide layer, an indium zinc oxide layer, an aluminum layer, a silver layer, and a molybdenum layer or a lamination thereof.

The present invention further provides a manufacture method of an anode connection structure of an organic light-emitting diode, which comprises the following steps:

(1) providing a substrate, wherein the substrate comprises a thin-film transistor formed thereon;

(2) forming a planarization layer on the thin-film transistor;

(3) forming a hole in the planarization layer and the thin-film transistor to expose the low-temperature poly-silicon layer of the thin-film transistor; and (4) forming an electrically conductive layer on the planarization layer and the exposed low-temperature poly-silicon layer and patternizing the electrically conductive layer to form a new source/drain on the low-temperature poly-silicon layer and also forming an anode of an organic light-emitting diode on the planarization layer, the anode of the organic light-emitting diode being connected to the new source/drain.

The thin-film transistor comprises the low-temperature poly-silicon layer that is formed on the substrate, a gate insulation layer formed on the low-temperature poly-silicon layer, a gate formed on the gate insulation layer, a protection layer formed on the gate, and a source/drain formed on the protection layer.

The substrate comprises a glass substrate.

An isolation layer is arranged between the substrate and the low-temperature poly-silicon layer.

The electrically conductive layer comprises one of an indium tin oxide layer, an indium zinc oxide layer, an aluminum layer, a silver layer, and a molybdenum layer or a lamination thereof.

The efficacy of the present invention is that the present invention provides an anode connection structure of an organic light-emitting diode and a manufacturing method thereof, wherein the anode of the organic light-emitting diode is directly connected to a low-temperature poly-silicon layer of a thin-film transistor without interconnection therebetween achieved with a source/drain metal layer so as to effectively reduce the distance between two adjacent switching thin-film transistors, thereby effectively reducing the pixel area, increasing the number of pixels in a unit area (each inch), and improving the resolution of a panel using the anode connection structure of the organic light-emitting diode.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
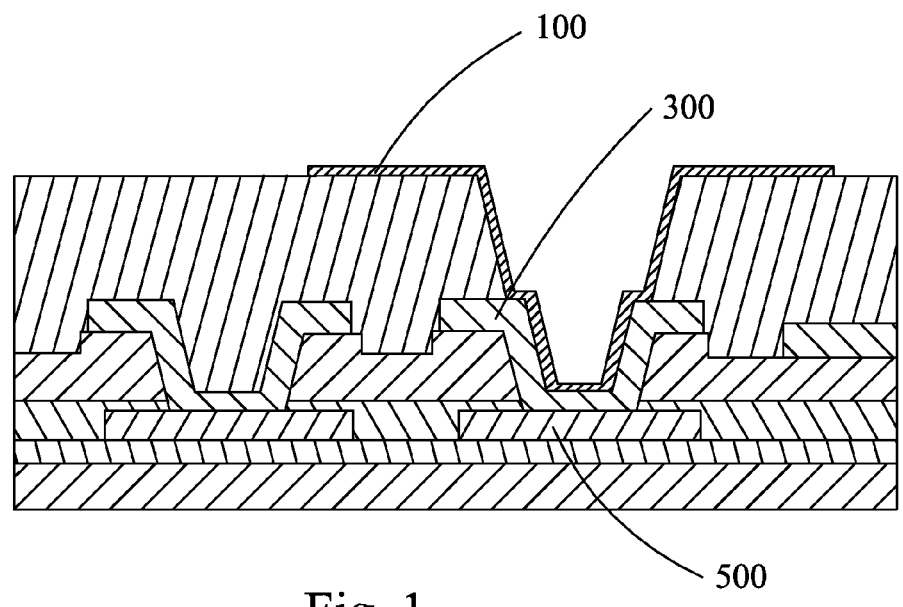
FIG. 1 is a schematic view showing the structure of a conventional anode connection structure of an organic light-emitting diode.
Figure 2:
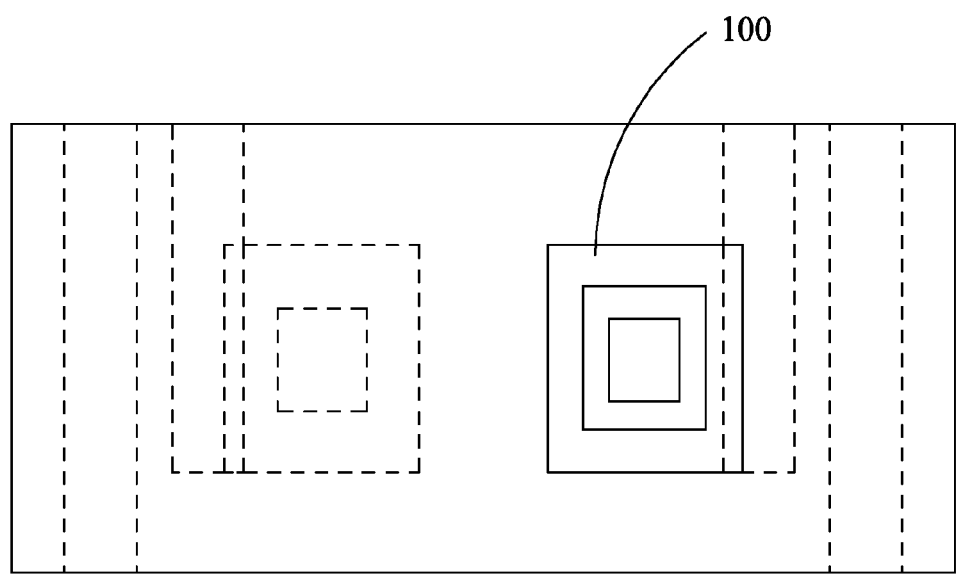
FIG. 2 is a top plan view of the conventional anode connection structure of the organic light-emitting diode.
Figure 3:
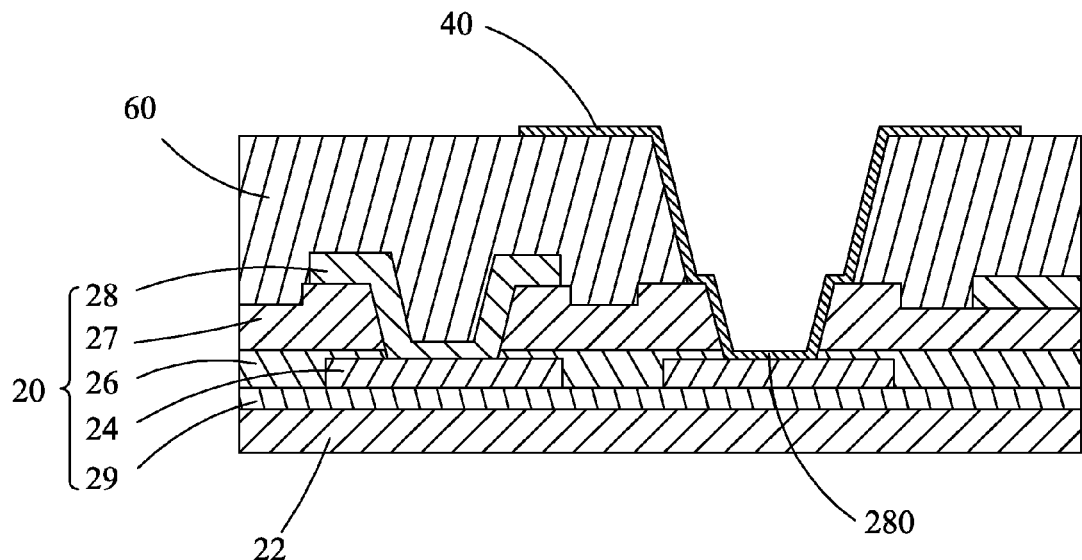
FIG. 3 is a schematic view showing the structure of an anode connection structure of an organic light-emitting diode according to the present invention.
Figure 4:
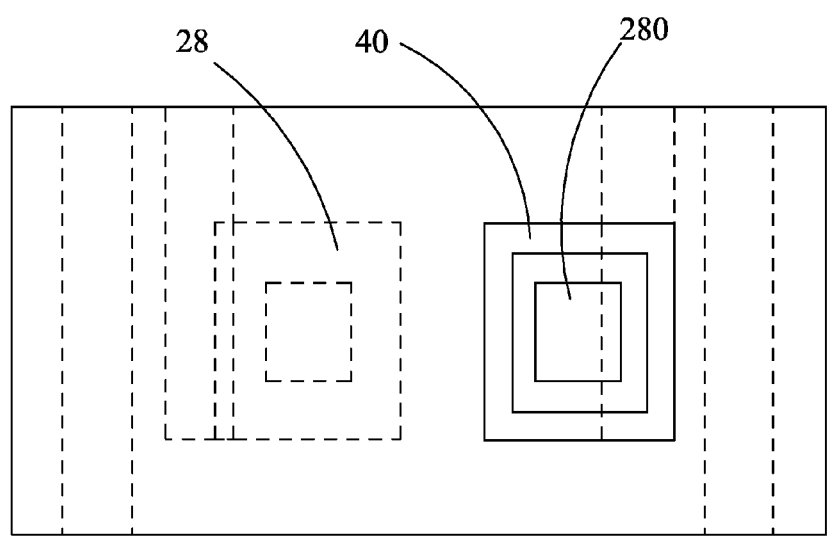
FIG. 4 is a top plan view of the anode connection structure of the organic light-emitting diode according to the present invention.

Referring to FIGS. 3 and 4, the present invention provides an anode connection structure of an organic light-emitting diode, which comprises: a thin-film transistor 20 and an anode 40 of an organic light-emitting diode arranged on the thin-film transistor 20. The thin-film transistor 20 comprises a low-temperature poly-silicon layer 24 formed on a substrate 22, a gate insulation (GI) layer 26 formed on the low-temperature poly-silicon layer 24, a gate (not shown) formed on the gate insulation layer 26, a protection layer (ILD) 27 formed on the gate, and a source/drain (SD) 28 formed on the protection layer 27. The anode 40 of the organic light-emitting diode is directly connected to the low-temperature poly-silicon layer 24 in order to reduce the distance between two adjacent switching thin-film transistors and thus effectively reducing the pixel area, increasing the number of pixels in a unit area (each inch), and improving the resolution of a panel using the anode connection structure of the organic light-emitting diode.

The thin-film transistor 20 comprises a switching thin-film transistor and a driving thin-film transistor. The anode 40 of the organic light-emitting diode is connected to the low-temperature poly-silicon layer 24 of the driving thin-film transistor.

Further arranged between the thin-film transistor 20 and the anode 40 of the organic light-emitting diode is a planarization layer 60, which avoids influence of displaying performance caused by corrosion and breaking resulting from impurities contained in the anode 40 of the organic light-emitting diode.

Specifically, the substrate 22 is a glass substrate and the anode 40 of the organic light-emitting diode comprises one of an indium tin oxide (ITO) layer, an indium zinc oxide (IZO) layer, an aluminum (Al) layer, a silver (Ag) layer, and a molybdenum (Mo) layer or a lamination thereof.

It is noted that an isolation layer 29 is further arranged between the substrate 22 and the low-temperature poly-silicon layer 24 to prevent impurities from spreading to the thin-film transistor 20 to cause malfunctioning of the thin-film transistor 20.

Figure 5:
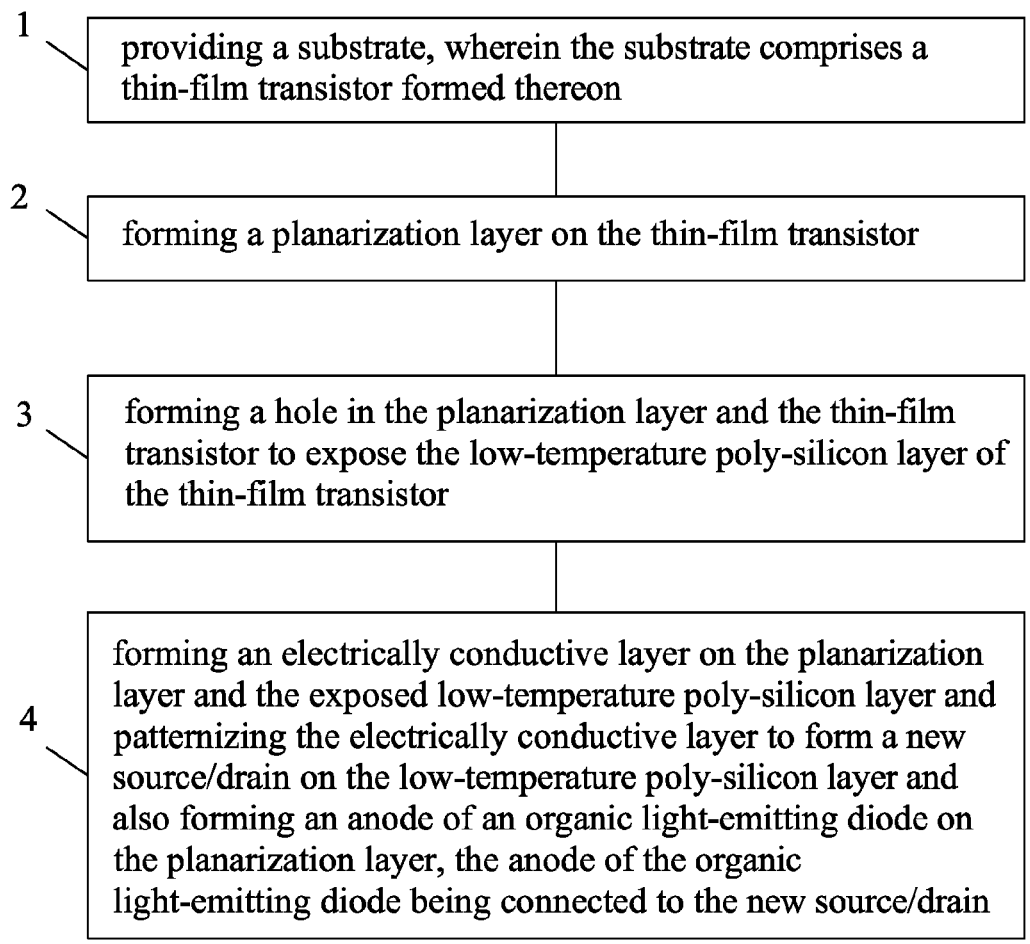
FIG. 5 is a flow chart illustrating a manufacturing method of an anode connection structure of an organic light-emitting diode according to the present invention.

Referring to FIG. 5, with collaborative reference to FIGS. 3 and 4, the present invention further provides a manufacturing method of an anode connection structure of an organic light-emitting diode, which comprises the following steps:

Step 1: providing a substrate 22, wherein the substrate 22 comprises a thin-film transistor 20 formed thereon.

The substrate 22 is a glass substrate. The thin-film transistor 20 comprises a low-temperature poly-silicon layer 24 formed on the substrate 22, a gate insulation layer 26 formed on the low-temperature poly-silicon layer 24, a gate formed on the gate insulation layer 26, a protection layer 27 formed on the gate, and a source/drain 28 formed on the protection layer 27.

The thin-film transistor 20 comprises a switching thin-film transistor and a driving thin-film transistor.

Step 2: forming a planarization layer 60 on the thin-film transistor 20.

The planarization layer 60 functions to avoid influence of displaying performance caused by corrosion and breaking resulting from impurities contained in the anode 40 of the organic light-emitting diode.

Step 3: forming a hole in the planarization layer 60 and the thin-film transistor 20 to expose the low-temperature poly-silicon layer 24 of the thin-film transistor 20.

Specifically, a masking process is applied to form a hole in the planarization layer 60 and the driving thin-film transistor at a location corresponding to the source/drain 28 in order to expose the metal layer that serves as the source/drain 28; and then, the metal layer of the source/drain 28 is etched off to expose the low-temperature poly-silicon layer 24 located thereunder.

Step 4: forming an electrically conductive layer on the planarization layer 60 and the exposed low-temperature poly-silicon layer 24 and patternizing the electrically conductive layer to form a new source/drain 280 on the low-temperature poly-silicon layer 24 thereby completing the entirety of the driving thin-film transistor, and at the same time, forming an anode 40 of the organic light-emitting diode on the planarization layer 60. Since the new source/drain 280 and the anode 40 of the organic light-emitting diode are both formed of the electrically conductive layer, in the manufacture process, the anode 40 of the organic light-emitting diode and the new source/drain 280 are not cut to separate from each other and the anode 40 of the organic light-emitting diode is directly connected to the low-temperature poly-silicon layer 24, so that the distance between two adjacent switching thin-film transistors can be effectively reduced, thereby effectively reducing the pixel area, increasing the number of pixels in a unit area (each inch), and improving the resolution of a panel using the anode connection structure of the organic light-emitting diode.

In the instant embodiment, the electrically conductive layer comprises one of an indium tin oxide layer, an indium zinc oxide layer, an aluminum layer, a silver layer, and a molybdenum layer or a lamination thereof.

It is noted that an isolation layer 29 can be further arranged between the substrate 22 and the low-temperature poly-silicon layer 24 to prevent impurities from spreading to the thin-film transistor 20 to cause malfunctioning of the thin-film transistor 20.

In summary, the present invention provides an anode connection structure of an organic light-emitting diode and a manufacturing method thereof, wherein the anode of the organic light-emitting diode is directly connected to a low-temperature poly-silicon layer of a thin-film transistor without interconnection therebetween achieved with a source/drain metal layer so as to effectively reduce the distance between two adjacent switching thin-film transistors, thereby effectively reducing the pixel area, increasing the number of pixels in a unit area (each inch), and improving the resolution of a panel using the anode connection structure of the organic light-emitting diode.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing an anode connection structure of an organic light-emitting diode, comprising the following steps:
   providing a substrate, wherein the substrate comprises a thin-film transistor formed thereon;
   forming a planarization layer on the thin-film transistor;
   forming a hole in the planarization layer and the thin-film transistor to expose a low-temperature poly-silicon layer of the thin-film transistor; and
   forming an electrically conductive layer on the planarization layer and the exposed low-temperature poly-silicon layer to be in direct contact engagement with the low-temperature poly-silicon layer and patternizing the electrically conductive layer to form a new source/drain on the low-temperature poly-silicon layer and also forming an anode of an organic light-emitting diode on the planarization layer, the anode of the organic light-emitting diode being connected to the new source/drain and in direct contact engagement with the low temperature poly-silicon layer.

2. The method as claimed in claim 1, wherein the thin-film transistor comprises the low-temperature poly-silicon layer that is formed on the substrate, a gate insulation layer formed on the low-temperature poly-silicon layer, a gate formed on the gate insulation layer, a protection layer formed on the gate, and a source/drain formed on the protection layer.

3. The method as claimed in claim 2, wherein the substrate comprises a glass substrate.

4. The method as claimed in claim 2, wherein an isolation layer is arranged between the substrate and the low-temperature poly-silicon layer.

5. The manufacturing method of an anode connection structure of an organic light-emitting diode as claimed in claim 2, wherein the electrically conductive layer comprises one of an indium tin oxide layer, an indium zinc oxide layer, an aluminum layer, a silver layer, and a molybdenum layer or a lamination thereof.

* * * * *